United States Patent
Seok

(10) Patent No.: US 10,361,276 B1
(45) Date of Patent: Jul. 23, 2019

(54) EMBEDDED FIELD PLATE FIELD EFFECT TRANSISTOR

(71) Applicant: Littelfuse, Inc., Chicago, IL (US)

(72) Inventor: Kyoung Wook Seok, Milpitas, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 15/924,186

(22) Filed: Mar. 17, 2018

(51) Int. Cl.
*H01L 29/40* (2006.01)
*H01L 29/06* (2006.01)
*H01L 29/08* (2006.01)
*H01L 29/10* (2006.01)
*H01L 29/41* (2006.01)
*H01L 29/78* (2006.01)
*H01L 29/423* (2006.01)
*H01L 29/417* (2006.01)

(52) U.S. Cl.
CPC ........ *H01L 29/407* (2013.01); *H01L 29/0696* (2013.01); *H01L 29/0865* (2013.01); *H01L 29/1095* (2013.01); *H01L 29/404* (2013.01); *H01L 29/41741* (2013.01); *H01L 29/4236* (2013.01); *H01L 29/7811* (2013.01); *H01L 29/7813* (2013.01)

(58) Field of Classification Search
CPC .............. H01L 29/407; H01L 29/0696; H01L 29/0865; H01L 29/1095; H01L 29/404; H01L 29/41741; H01L 29/4236; H01L 29/7811; H01L 29/7813
See application file for complete search history.

(56) References Cited

U.S. PATENT DOCUMENTS

| | | | | |
|---|---|---|---|---|
| 7,642,597 B2 * | 1/2010 | Saito | ................... | H01L 29/0634 257/287 |
| 7,879,686 B2 * | 2/2011 | Blank | ................ | H01L 29/7813 438/454 |
| 8,143,123 B2 * | 3/2012 | Grebs | ................ | H01L 21/3065 438/259 |
| 8,372,717 B2 * | 2/2013 | Hsieh | ................. | H01L 29/0634 438/270 |
| 8,415,739 B2 * | 4/2013 | Venkatraman | ........ | H01L 29/407 |
| 8,476,136 B2 * | 7/2013 | Borzi | .................... | H01L 29/407 438/270 |
| 8,936,985 B2 * | 1/2015 | Challa | ................ | H01L 21/3065 438/270 |
| 9,431,392 B2 * | 8/2016 | Rieger | ................ | H01L 27/0629 |
| 9,450,062 B2 * | 9/2016 | Hutzler | ............ | H01L 29/66333 |

(Continued)

*Primary Examiner* — Ida M Soward

(57) ABSTRACT

A trench N-channel field effect transistor has an active area and an edge area. A first pair of parallel-extending deep trenches extends parallel to a side edge of the die. A second pair of parallel-extending deep trenches extends perpendicularly to the side edge, toward the side edge, so that each trench of the second pair terminates into the inside deep trench of the first pair. An embedded field plate structure is embedded in these trenches. A plurality of floating P type well regions is disposed entirely between the second pair of deep trenches, between the active area and the inside deep trench of the first pair. Using this edge area structure, the breakdown voltage $BV_{DSS}$ of the overall device is increased because the breakdown voltage of the edge area is increased as compared to the same structure without the floating P type well regions.

16 Claims, 14 Drawing Sheets

TOP-DOWN VIEW OF DIE AT THE SEMICONDUCTOR SURFACE
(LAYERS ABOVE SEMICONDUCTOR NOT SHOWN)

PERSPECTIVE DIAGRAM OF ACTIVE AREA WITH TRENCH FILL MATERIAL AND STRUCTURE ABOVE THE SEMICONDUCTOR SURFACE SHOWN
(LOOKING AT SECTIONAL LINE A-A')

(56) References Cited

U.S. PATENT DOCUMENTS

| | | | | |
|---|---|---|---|---|
| 9,472,662 | B2* | 10/2016 | Stefanov | H01L 27/088 |
| 9,716,152 | B2* | 7/2017 | Nagata | H01L 29/407 |
| 9,761,676 | B2* | 9/2017 | Henson | H01L 29/407 |
| 9,905,685 | B2* | 2/2018 | Siemieniec | H01L 29/42368 |
| 2011/0312166 | A1* | 12/2011 | Yedinak | H01L 21/3065 |
| | | | | 438/488 |
| 2014/0209999 | A1* | 7/2014 | Sato | H01L 29/7813 |
| | | | | 257/330 |
| 2015/0206937 | A1* | 7/2015 | Yedinak | H01L 29/7397 |
| | | | | 257/334 |
| 2016/0064497 | A1* | 3/2016 | Darwish | H01L 29/7823 |
| | | | | 327/434 |
| 2017/0236934 | A1* | 8/2017 | Rankila | H01L 29/7813 |
| | | | | 257/330 |
| 2017/0263699 | A1* | 9/2017 | Kobayashi | H01L 29/0634 |
| 2017/0330962 | A1* | 11/2017 | Zeng | H01L 29/7397 |
| 2018/0114857 | A1* | 4/2018 | Okada | H01L 29/78 |

* cited by examiner

TOP-DOWN VIEW OF DIE SHOWING METAL LAYERS

TOP-DOWN VIEW OF DIE AT THE SEMICONDUCTOR SURFACE
(LAYERS ABOVE SEMICONDUCTOR NOT SHOWN)

TOP-DOWN VIEW OF DIE AT THE SEMICONDUCTOR SURFACE
(LAYERS ABOVE SEMICONDUCTOR NOT SHOWN)

TOP-DOWN VIEW OF DIE AT THE SEMICONDUCTOR SURFACE
(LAYERS ABOVE SEMICONDUCTOR NOT SHOWN)

CROSS-SECTIONAL DIAGRAM OF ACTIVE AREA
(TAKEN ALONG SECTIONAL LINE A-A')

PERSPECTIVE DIAGRAM OF ACTIVE AREA WITH TRENCH FILL MATERIAL AND
STRUCTURE ABOVE THE SEMICONDUCTOR SURFACE SHOWN
(LOOKING AT SECTIONAL LINE A-A')

PERSPECTIVE DIAGRAM OF ACTIVE AREA WITH TRENCH FILL MATERIAL
AND STRUCTURE ABOVE THE SEMICONDUCTOR SURFACE NOT SHOWN
(LOOKING AT SECTIONAL LINE A-A')

CROSS-SECTIONAL DIAGRAM OF EDGE AREA
(TAKEN ALONG SECTIONAL LINE C-C')

PERSPECTIVE DIAGRAM OF EDGE AREA
SHOWING THE BODY METAL
(LOOKING AT SECTIONAL LINE C-C')

PERSPECTIVE DIAGRAM OF EDGE AREA
WITH TRENCH FILL MATERIAL AND STRUCTURE ABOVE THE
SEMICONDUCTOR SURFACE SHOWN
(LOOKING AT SECTIONAL LINE C-C')

PERSPECTIVE DIAGRAM OF EDGE AREA
WITH TRENCH FILL MATERIAL AND STRUCTURE ABOVE THE
SEMICONDUCTOR SURFACE NOT SHOWN
(LOOKING AT SECTIONAL LINE C-C')

STRUCTURES ALONG A LINE EXTENDING PERPENDICULARLY
INWARD FROM THE EDGE OF THE DIE

ACTIVE AREA

EDGE AREA

EMBEDDED FIELD PLATE FIELD EFFECT TRANSISTOR

TECHNICAL FIELD

The described embodiments relate to power field effect transistors and to related methods.

BACKGROUND INFORMATION

In order to increase the drain-to-source voltage at which a trench power field effect transistors (also called power trench MOSFETs) first suffer avalanche breakdown, a type of trench power MOSFET involving a "buried field plate" is being popularized. This type of trench power MOSFET goes by various other names. The term "buried source", for example, is also sometimes used. The term "RESURF" is also used in connection with this type of trench power MOSFET. In a typical structure, the buried field plate transistor is a trench MOSFET that has an especially deep trench. Within this deep trench, along with the gate, is a vertically-oriented conductive buried field plate. This buried field plate is typically disposed below the gate so that it extends along the inside side surfaces of the deepest parts of the deep trench. The buried field plate, like the gate above it, is separated from the semiconductor material of the trench sidewall by an insulative dielectric layer. Due to its placement, the buried field plate extends along and adjacent to the drift zone in the N− type semiconductor material that is immediately outside the deep trench. This drift zone is an amount of N− type semiconductor material disposed underneath the P type body region of the transistor. By coupling the buried field plate to the source electrode of the transistor, the breakdown voltage BVDSS of the transistor can be increased for a given RDS(ON) and integrated circuit size as compared to the same basic trench MOSFETs structure without the buried field plate. There are many variations on this general transistor structure.

SUMMARY

The semiconductor portion of a trench power N-channel field effect transistor die has plurality of deep trenches cut into its topside semiconductor surface. A first of these deep trenches extends in a first straight line parallel to a side edge of the die. A second of these deep trenches extends in a second straight line parallel to the first straight line, such that the first deep trench is disposed between the second deep trench and the side edge of the die. These two deep trenches extend parallel to each other, and parallel to the side edge of the die. There may be more such parallel extending deep trenches, but there are at least these two. In addition, a third deep trench extends in a third straight line perpendicular to the side edge of the die. This third deep trench terminates into the second deep trench. A fourth deep trench extends in a fourth straight line perpendicular to the side edge of the die. The fourth deep trench also terminates into the second deep trench. The third and fourth deep trenches extend parallel to one another, and there is no deep trench between them. The trench power N-channel field effect transistor die also has an embedded field plate structure. In one example, a first part of this embedded field plate structure is disposed at least partly in the first deep trench, a second part of this embedded field plate structure is disposed at least partly in the second deep trench, a third part of this embedded field plate structure is disposed at least partly in the third deep trench, and a fourth part of this embedded field plate structure is disposed at least partly in the fourth deep trench.

When considered from the top-down perspective, the trench power N-channel field effect transistor die has an edge area and an active area. The edge area is disposed adjacent the side edge of the die. There are no gates or N+ type source regions in this edge area. The active area, on other hand, has gates and N+ type source regions. The edge area is disposed between the active area of the die and the die side edge.

When considered from a cross-sectional side view perspective, the semiconductor portion of the die involves a bottom N++ type substrate layer. Disposed on that N++ type substrate layer is an N− type drift layer that extends up to the topside semiconductor surface. This N− type drift layer has a lower layer portion, and a more highly doped N− type upper layer portion. The deep trenches cut into the N− type upper layer portion and extend down through the N− type upper layer portion so that they just penetrate the top of the N− type lower layer portion.

In the active area, between the third and fourth deep trenches, is a P type body region. This P type body region extends down into the N− type drift layer from the topside semiconductor surface. The N+ type source region is disposed between the third and fourth deep trenches in the active area. The P type body region also extends laterally from the active area (through a gate bus line and embedded field plate grounding area) and into the edge area.

The trench power N-channel field effect transistor die has a topside source metal electrode structure, a topside gate metal electrode structure, and a bottomside drain metal electrode structure. The source metal electrode structure is coupled to the N+ type source region or regions of the active area, and is also coupled to the P type body region or regions of the active area. The gate metal electrode structure is coupled to the gate or gates of the active area. The drain metal electrode structure is disposed on the bottom of the semiconductor portion of the die so that it is coupled to the bottomside semiconductor surface, and is in contact with the N++ type substrate layer.

In addition, the trench power N-channel field effect transistor die includes a first floating P type well region and a second floating P type well region. The first floating P type well region extends down into the N− type drift layer from the topside semiconductor surface. It is disposed entirely in the edge area of the semiconductor die structure, and entirely between the third and fourth deep trenches. Likewise, the second floating P type well region extends down into the N− type drift layer from the topside semiconductor surface. It is disposed entirely in the edge area of the semiconductor die structure, and entirely between the third and fourth deep trenches.

The first and second floating P type well regions are disposed such that they are disposed along a fifth straight line. The fifth straight line extends perpendicularly from the side edge of the semiconductor die structure, and extends transversely through the first and second deep trenches, and extends between the third and fourth trenches, and into the active area of the semiconductor die structure. This fifth line is parallel to the third straight line of the third deep trench and is also parallel to the fourth straight line of the fourth deep trench. The first and second floating P type well regions are disposed along this fifth straight line between the P type body region and the second deep trench. In one example, the first floating P type well region is the outer of the two (the one closest to the die side edge), and this first floating P type well region forms a part of an inner sidewall of the second deep trench. These first and second floating P type well regions are "floating" in the sense that they are not coupled to the source electrode structure, the drain electrode structure, or the gate electrode structure of the overall MOSFET device. In a situation of a large voltage on the drain electrode structure with respect to the source electrode structure, the first and second floating P type well regions serve to prevent avalanche breakdown in the edge area. In one example, the trench power N-channel field effect transistor die would suffer avalanche breakdown in the edge area near the second deep trench were a set of floating P type well regions (including the first and second floating P type well regions) not provided. By providing this set of floating P type well regions, the overall trench power N-channel field effect transistor die does not suffer avalanche breakdown first in the edge area, but rather it suffers avalanche breakdown first in the active area. Accordingly, the drain-to-source breakdown voltage BVDSS of the overall transistor device is increased.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "left", "right", "top", "topside", "up", "upward", "down", "downward", "vertically", "lateral", "laterally", "side", "under", "backside", "bottom" and "bottomside" are used herein to describe relative orientations between different parts of the structure being described, and it is to be understood that the overall structure being described can actually be oriented in any way in three-dimensional space. In the description below, N type silicon can be generally referred to simply as N type silicon or it can be more specifically referred to as N++ type silicon, N+ type silicon, N type silicon, or N− type silicon. The N++, N+, N and N− designators are intended to designate relative ranges of dopant concentrations in a rough general sense. There may, for example, be an overlap in the ranges of concentrations between silicon described as N− type silicon and silicon described as N type silicon. The dopant concentration at the bottom of the N+ type silicon range may be lower than the dopant concentration at the top of the N type silicon range. The same manner of describing P type silicon (in terms of sometimes more specifically referring to P++ type silicon, P+ type silicon, P type silicon, or P− type silicon) is also employed in this patent document.

Figure 1:
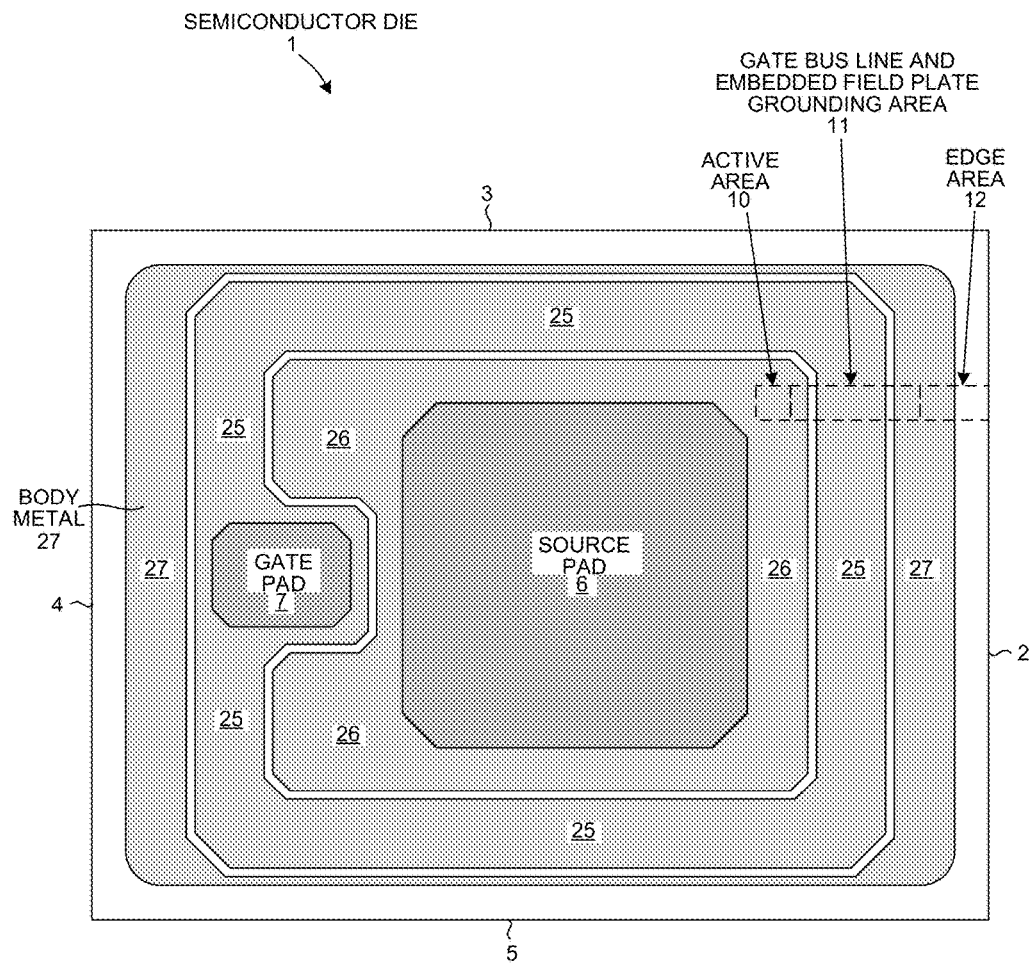
FIG. 1 is a top-down diagram of a semiconductor die structure 1 in accordance with one novel aspect.

FIG. 1 is a top-down diagram of a semiconductor die structure 1 in accordance with one novel aspect. This semiconductor die structure 1 is an embedded field plate N-channel field effect transistor die, also known as an EFP MOSFET. "EFP" stands for "Embedded Field Plate". Semiconductor die structure 1 has four peripheral side edges 2-5 when the die structure is considered from the top-down perspective. On the top of the die structure is a source metal electrode structure 26, a metal first peripheral deep trench 6 which is a part of the source metal electrode structure 26, a metal gate electrode structure 25, a gate pad 7 which is a part of the metal gate electrode structure 25, a body metal structure 27, and a metal depletion stopper ring (not shown). The metal depletion stopper ring is another ring of metal that encircles the body metal structure and that extends along the far peripheral side edges of the die structure.

In this layout, the gate electrode structure is placed between the body metal and the source electrode in order to be able to make the gate electrode structure a loop. Making the gate electrode structure have a loop shape promotes more even gate signal distribution. In addition, if avalanche breakdown were to occur in the edge area, the separation between the source metal and the body metal would provide some resistance in this current path, which is desirable and improves device ruggedness.

Figure 2:
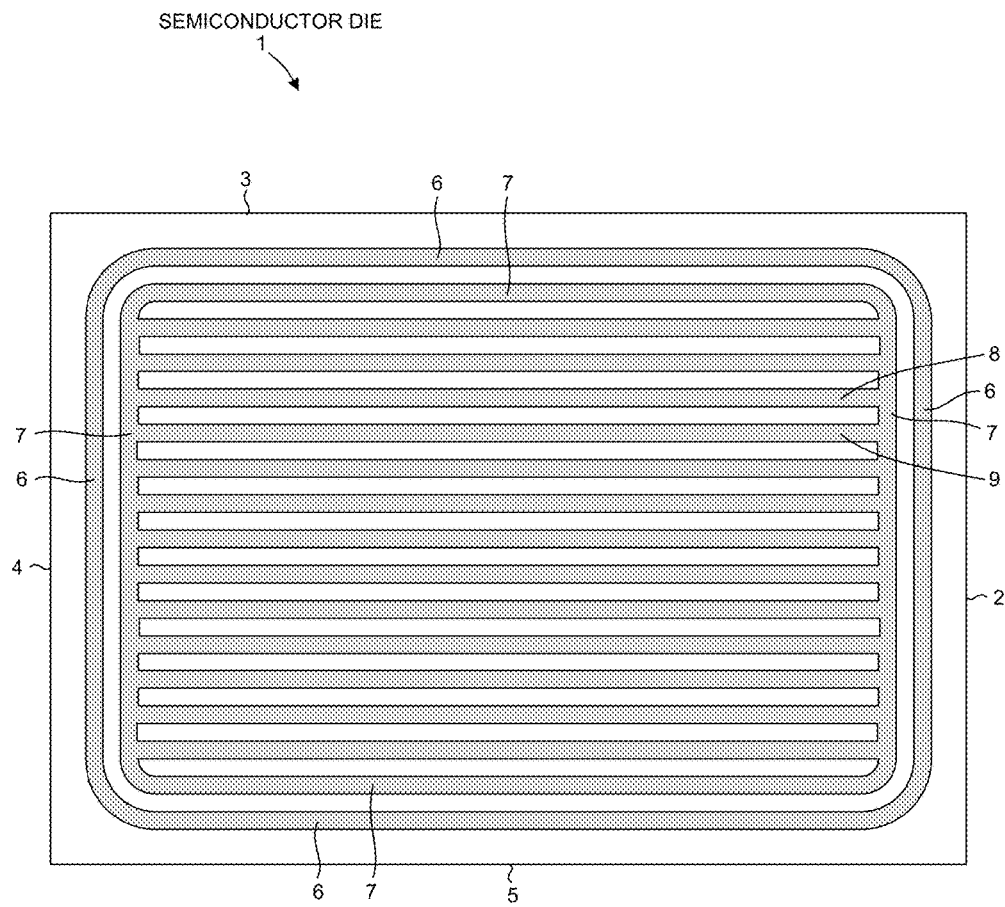
FIG. 2 is a simplified top-down diagram that shows the deep trenches in the topside semiconductor surface of the semiconductor die structure 1 of FIG. 1.

FIG. 2 is a simplified top-down diagram of the semiconductor die structure 1 of FIG. 1, except that in the illustration of FIG. 2 the structure above the level of the topside semiconductor surface is not shown. The portions of the die structure that are shown as white in FIG. 2 are the topside semiconductor surface. The shaded portions are a plurality of deep trenches and any structures in them such as embedded field plates. Of particular note is a first peripheral deep trench 6. This first peripheral deep trench 6 extends in a first straight line in the vertical dimension in the illustration in parallel with the right side edge 2 of the die structure. Reference numeral 7 indicates a second peripheral deep trench. This second peripheral deep trench 7 extends around the edges of the die but is inside the first peripheral deep trench 6. This second peripheral deep trench 7 extends in a second straight line along the right side edge 2 of the die structure. Reference numeral 8 identifies a third deep trench. This third deep trench 8 extends in a third straight line. Its left end terminates at a location into the second peripheral deep trench 7 on the left of the die structure. Its right end terminates at another location into the second peripheral deep trench 7 on the right of the die structure. Likewise, the fourth deep trench 9 extends in a straight line. Its left end terminates at a location into the second peripheral deep trench 7 on the left of the die structure. Its right end terminates at another location into the second peripheral deep trench 7 on the right of the die structure. The third and fourth deep trenches 8 and 9 extend parallel to each other across the center part of the die as illustrated. The third and fourth deep trenches 8 and 9 are referred to as being separate deep trenches even though the three deep trenches 7, 8 and 9 actually merge together to form a single deep trench structure. The deep trenches are illustrated in FIG. 2 to be fairly wide in order to clarify the illustration. In actuality, there are many more horizontally extending deep trenches, and these deep trenches are much more narrow than the trenches illustrated. Not only are the deep trenches much more narrow than the trenches illustrated in FIG. 2, but there is also much less separation between adjacent ones of the deep trenches. Located in the center of each deep trench is an embedded field plate structure. This embedded field plate structure is not shown in FIG. 2. In addition, in the active area 10 of the die structure, there are gate structures and other structures that extend up to the topside semiconductor surface 17 that are not illustrated. These other structures are not shown in FIG. 2 in order to simplify the diagram.

Figure 3:
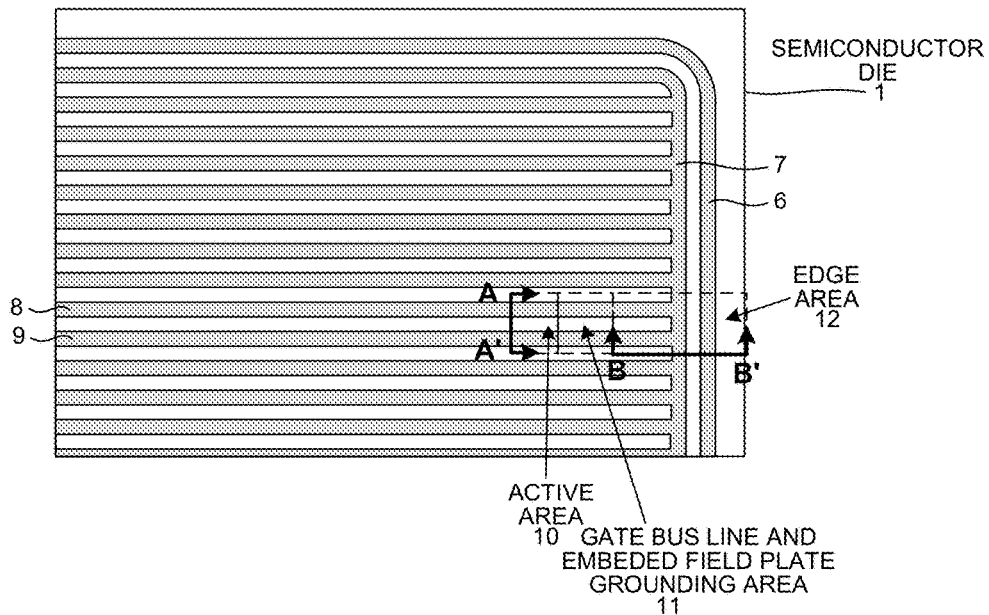
FIG. 3 is a diagram of the upper right corner portion of the semiconductor die structure 1 that shows the active area, the gate bus line and embedded field plate grounding area, and the edge area.

FIG. 3 is a diagram of the upper right corner portion of the semiconductor die structure 1. In this diagram, more deep trenches are shown and the deep trenches that are shown have a tighter spacing. The diagram is provided to point out three areas, namely an active area 10, a gate bus line and embedded field plate grounding area 11, and an edge area 12. Sectional line A-A' is a sectional line taken at the left side of the active area 10. Sectional line B-B' is a sectional line taken at the bottom side of the edge area 12.

Figure 4:
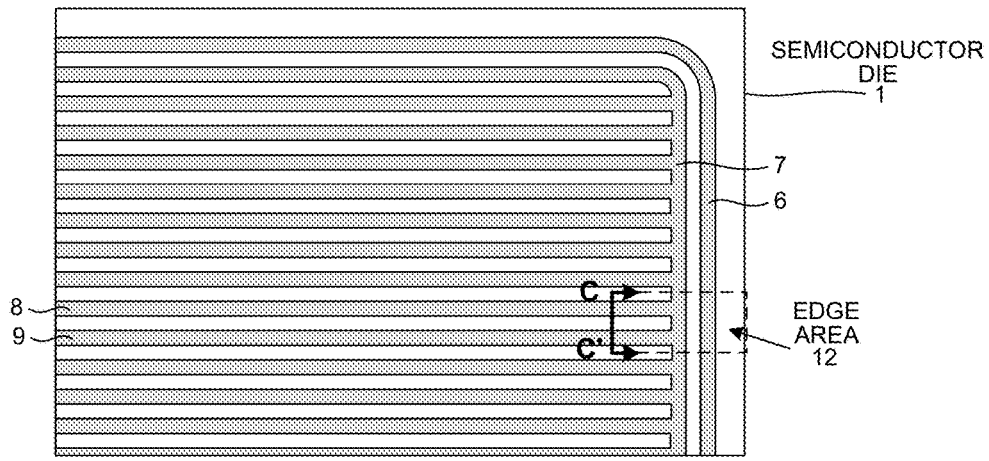
FIG. 4 is a diagram similar to FIG. 3, except that FIG. 4 shows where a sectional line C-C' is taken.

FIG. 4 is a diagram similar to FIG. 3, except that FIG. 4 shows where a sectional line C-C' is taken. Sectional line C-C' is taken at the left side of edge area 12.

Figure 5:
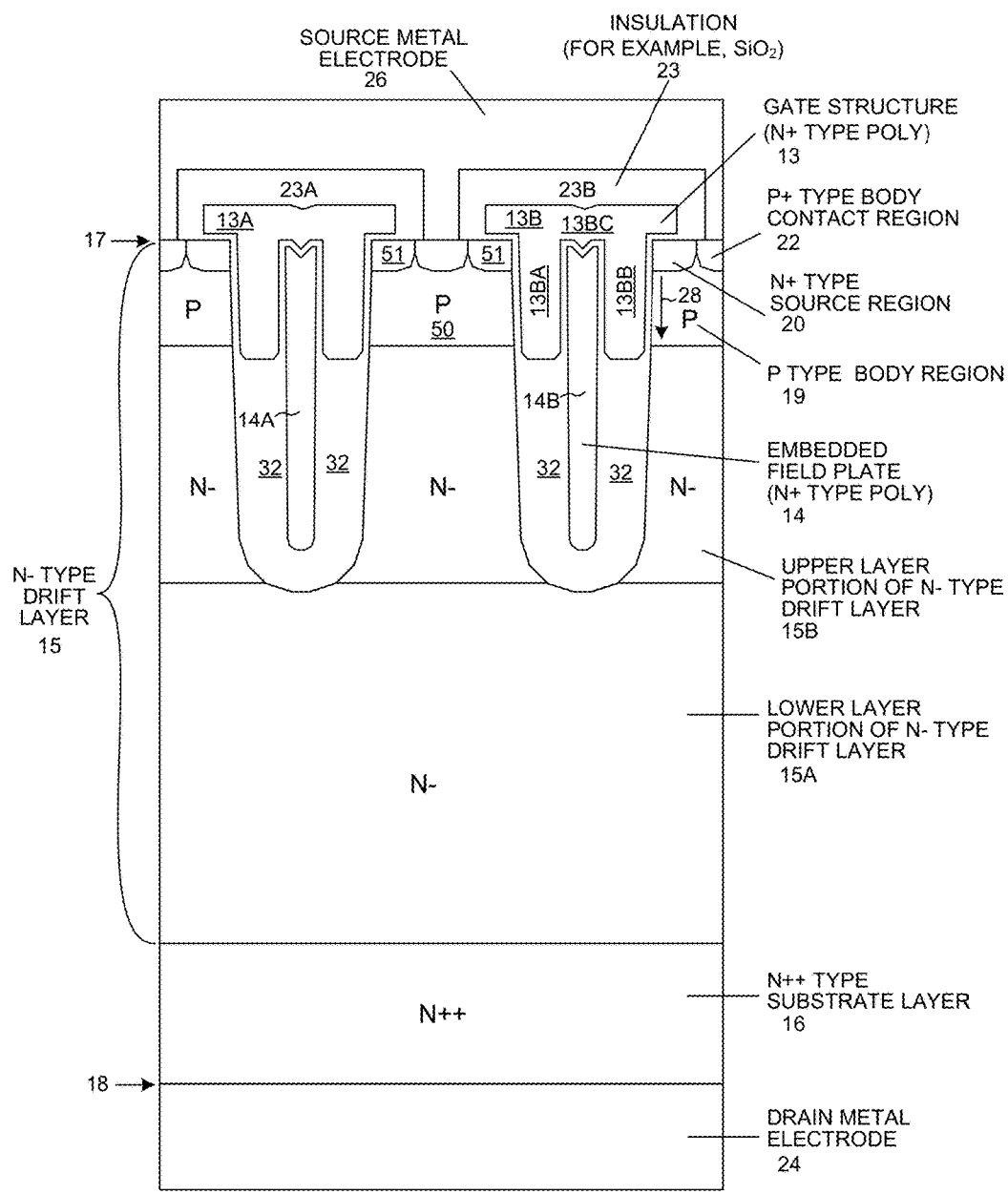
FIG. 5 is a cross-sectional diagram taken along sectional line A-A' of FIG. 3.

FIG. 5 is a cross-sectional diagram taken along sectional line A-A' of FIG. 3. The deep trench shown at the left is the third deep trench 8. The deep trench shown to the right is the fourth deep trench 9. A part 13A of a gate structure 13 extends into the third deep trench 8 at the left, and a part 13B of the gate structure 13 extends into the fourth deep trench 9 at the right. These parts 13A and 13B of the gate structure 13 are features of N+ type polysilicon. The overall gate structure is identified by reference numeral 13. Reference numerals 14A and 14B identify parts of an embedded field plate structure 14. If a deep trench anywhere on the die is seen in cross-section at the topside semiconductor surface, there is a part of the embedded field plate structure 14 there that appears as do the parts 14A and 14B in the illustration of FIG. 5. The embedded field plate structure 14 is a structure of N+ type polysilicon. An N– type drift layer 15 is disposed on an N++ type substrate layer 16. The N++ type substrate layer 16 is monocrystalline wafer material whereas the N– type drive layer is typically epitaxial silicon.

The N– type drift layer 15 in turn includes a lower layer portion 15A and an upper layer portion 15B. The upper layer portion 15B of the N– type drift layer has a higher concentration of N type dopants than does the lower layer portion 15A of the N– type drift layer. The N– type drift layer 15 is labeled as extending all the way up to the topside semiconductor surface 17 because it does extend up to this surface outside of the plane of the illustration. The deep trenches extend down from the topside semiconductor surface 17, and extend through the upper layer portion 15B of the N– type drift layer, and into the top of the lower layer portion 15A of the N– type drift layer. Reference numeral 32 identifies insulative dielectric material in the deep trenches. This insulative dielectric material 32 is typically thermal silicon oxide. This insulative dielectric material 32 separates the semiconductor sidewalls of the deep trenches from the parts of the gate structure 13 and from the parts of the embedded field plate structure 14. Reference numeral 18 identifies the bottomside semiconductor surface. P type body regions extend downward from the topside semiconductor surface 17 as shown. Reference numeral 19 at the right of FIG. 5 identifies one of the P type body regions. A set of N+ type source regions extends downward from the topside semiconductor surface 17 into the P type body regions as shown. One of these N+ type source regions is identified by reference numeral 20. These N+ type source regions have a ladder shape when considered from the top-down perspective. The ladder shape involves two parallel-extending sides, and a set of spanning rungs. Source metal electrode structure 26 is coupled to the top of such an N+ type source region at its rung areas. These connection points between the source metal electrode structure 26 and the N+ type source regions are not present in the particular cross-section of FIG. 5. In addition, the source metal electrode structure 26 is also coupled to the P type body regions by P+ type body contact regions. For example, source metal electrode structure 26 is coupled to P type body region 19 at the right of FIG. 5 by P+ type body contact region 22. Insulative dielectric features 23A and 23B separate the source metal electrode structure 26 from the gate structure 13. The gate bus line and embedded field plate grounding area 11 and metal gate electrode structure 25 (see FIG. 1) on the top of the die structure is not seen in the particular cross-section of FIG. 5, but the metal gate electrode structure 25 is coupled by connections elsewhere on the die to the N+ type polysilicon of the gate structure 13. A drain metal electrode structure 24 is disposed on the bottomside semiconductor surface 18.

When a positive voltage higher than the threshold voltage of the transistor device is placed on the gate structure 13 with respect to the source metal electrode structure 26, then a conductive channel forms at the edge of the trench adjacent the gate structure. This channel extends vertically downward from the N+ type source region, through the P type body region, and to the underlying N– type material of the – type drift layer 15. Under the influence of a source-to-drain voltage, electrons can flow from the N+ type source region, vertically down through this conductive channel, and to the N− type drift layer 15, through the N− type drift layer 15, and through the N++ type substrate layer 16, and to the drain metal electrode structure 24. For example, in the case of N+ type source region 20, the channel is illustrated by arrow 28.

When a deep trench is considered in cross-section as in the case of FIG. 5, the embedded field plate within the deep trench extends downward starting from a starting point at or very near to the topside semiconductor surface 17 and extending downward through the center of the deep trench to a depth that is close to the depth of the upper layer portion 15B of the N− type drift layer 15. When a deep trench is considered in cross-section as in the case of FIG. 5, the gate structure has a first downward extending portion that extends downward along the boundary between one side edge of the deep trench and a P type body region on that side of the deep trench, and also has a second downward extending portion that extends downward along the boundary between an opposite side edge of the deep trench and the P type body region on that side of the deep trench. In FIG. 5, reference numeral 13BA identifies one such first downward extending portion of the gate structure portion in fourth deep trench 9, and reference numeral 13BB identifies one such second downward extending portion of the gate structure in fourth deep trench 9. The two downward extending portions 13BA and 13BB are connected together at the top by a bridge portion 13BC of the gate structure. This bridge portion 13BC is disposed above the topside semiconductor surface 17, and it bridges and spans over the top extent of the embedded field plate portion 14B as shown in FIG. 5. The two downward extending portions 13BA and 13BB and the bridge portion 13BC are all fashioned from the same layer of N+ type polysilicon. The term "layer" here refers to a contiguous amount of polysilicon, where that polysilicon is polysilicon that was deposited in the same polysilicon deposition step. In this sense, downward extending portions 13BA, 13BB and bridge portion 13BC are one layer of polysilicon.

Figure 6:
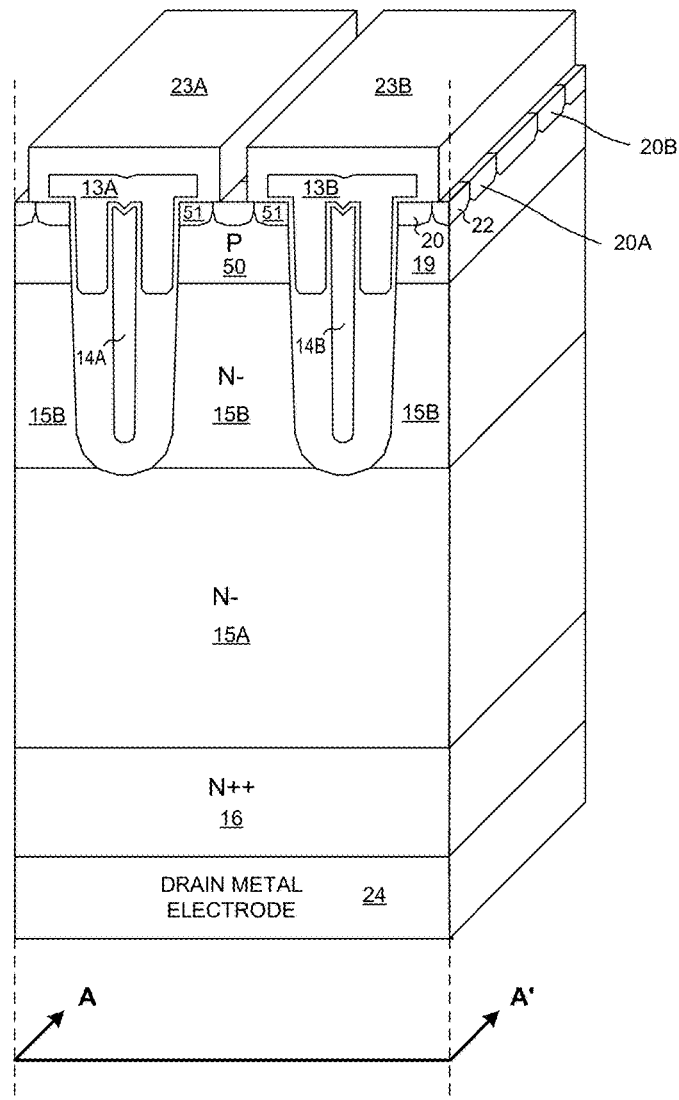
FIG. 6 is a perspective diagram of the part of the active area illustrated in cross-section in FIG. 5.
Figure 16:
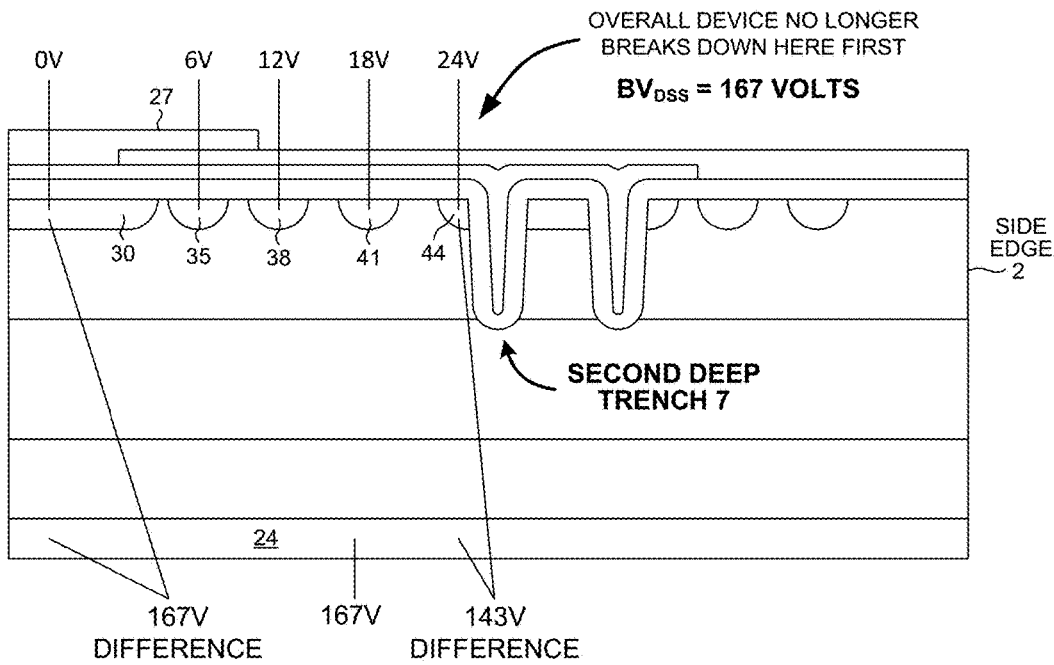
FIG. 16 illustrates the novel semiconductor die structure to which the graph of FIG. 15 pertains.

FIG. 6 is a perspective diagram of the part of the active area illustrated in cross-section in FIG. 5. Two rung portions 20A and 20B of the ladder-shaped N+ type source region 20 are seen in the structure of FIG. 16. The rung portions are actually parts of the overall N+ type source region 20.

Figure 7:
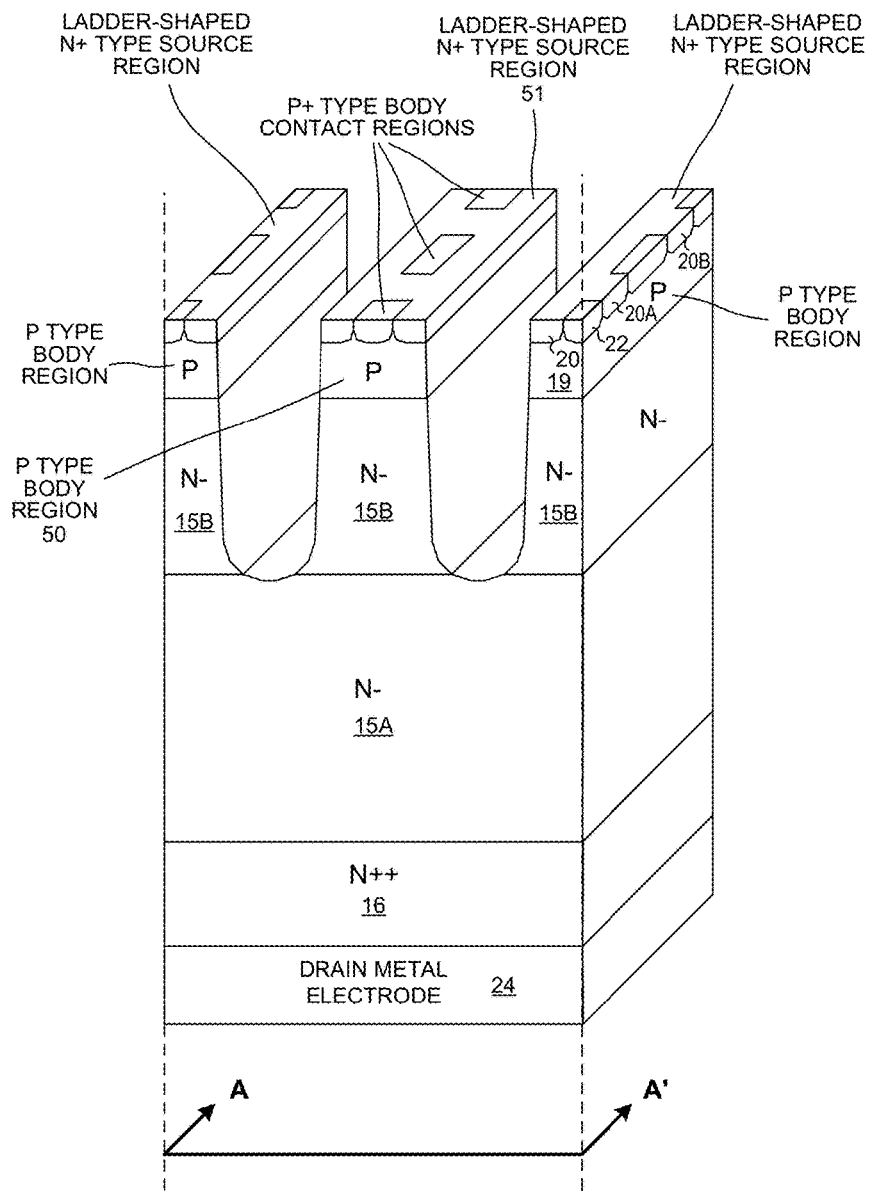
FIG. 7 is a perspective diagram of the structure of FIG. 6, but with the trench fill material not shown and with the structure above the topside semiconductor surface not shown.

FIG. 7 is a perspective diagram of the structure of FIG. 6, but with the trench fill material not shown and with the structure above the topside semiconductor surface not shown. The ladder-shaped N+ type source regions are seen from this perspective. Between the rungs of a ladder-shaped N+ type source region are P+ type body contact regions.

Figure 8:
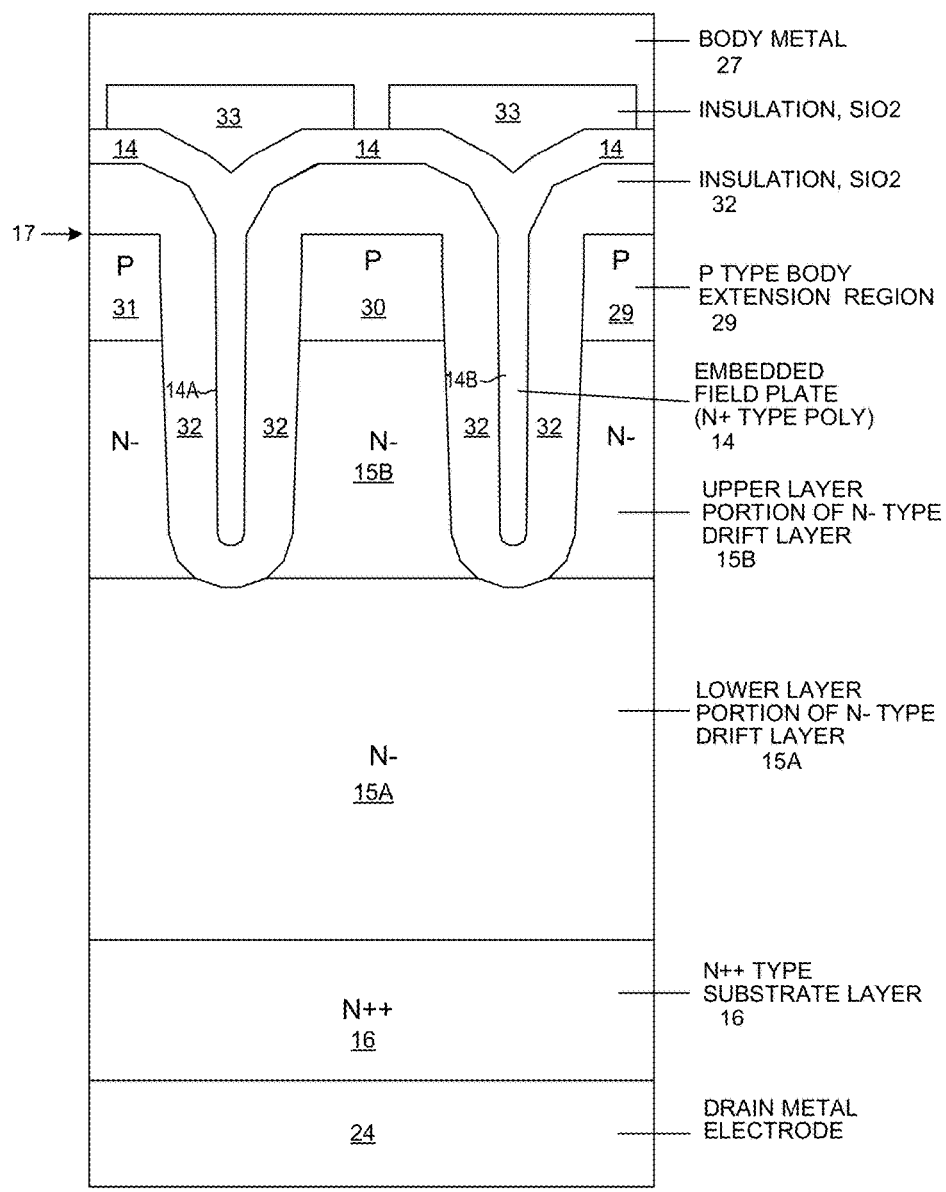
FIG. 8 is a cross-sectional diagram taken along sectional line C-C' of the edge area 12 of FIG. 3 and FIG. 4.

FIG. 8 is a cross-sectional diagram taken along sectional line C-C' of the edge area 12 of FIG. 3 and FIG. 4. The drain metal electrode structure 24, the N++ type substrate layer 16, and lower layer portion 15A of the N− type drift layer 15, and the upper layer portion 15B of the N− type drift layer 15 are the same structures as in the cross-section of the active area 10 of FIG. 5. Reference numerals 29, 30 and 31 identify extensions of P type body regions of the active area. In particular, P type body region extension 30 is an extension of the P type body region 50. Reference numeral 14 identifies the embedded field plate structure of N+ type polysilicon. This is the same N+ type polysilicon layer that makes the embedded field plate portions 14A and 14B of FIG. 5. The embedded field plate structure of FIG. 8 and the embedded field plate structures of FIG. 5 are all different parts of the same one amount of N+ type polysilicon. The body metal structure 27 at the top of FIG. 8 is the same body metal structure 27 shown in FIG. 1. Reference numeral −33?? identifies a feature of a trench-fill insulative dielectric layer. This is the same layer of trench-fill insulative dielectric that forms the trench-fill insulative dielectric features 23A and 23B in the active area shown in FIG. 5. The insulative dielectric layer 33 of FIG. 8 is the same insulative dielectric layer as identified by reference numeral 23 in the cross-section of FIG. 5. There are no N+ type source regions in the edge area 12. There are no gate structures in the edge area 12. The gate structure 13 does not extend into the edge area 12.

Figure 9:
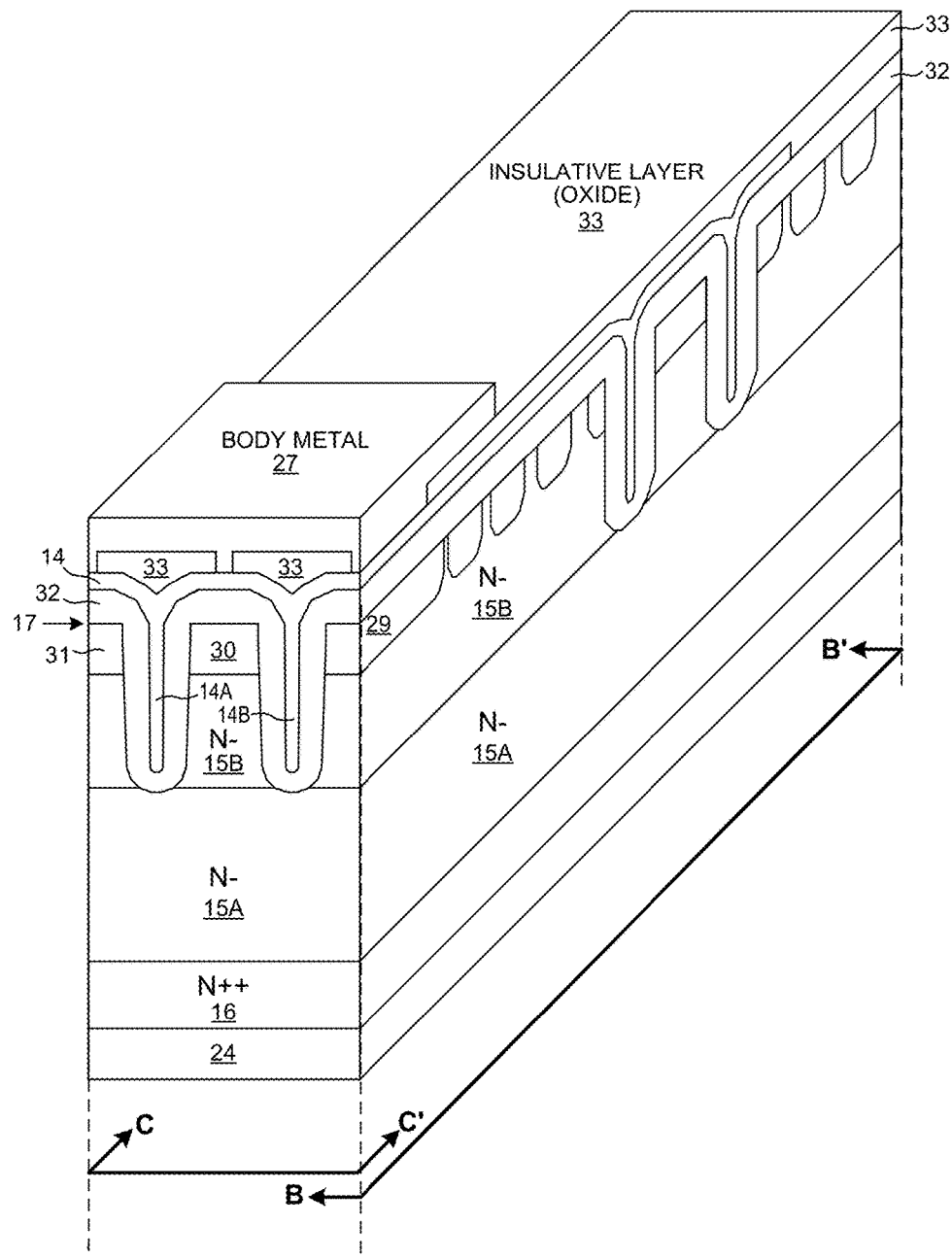
FIG. 9 is a perspective diagram of the edge area of FIG. 8.

FIG. 9 is a perspective diagram of the edge area 12.

Figure 10:
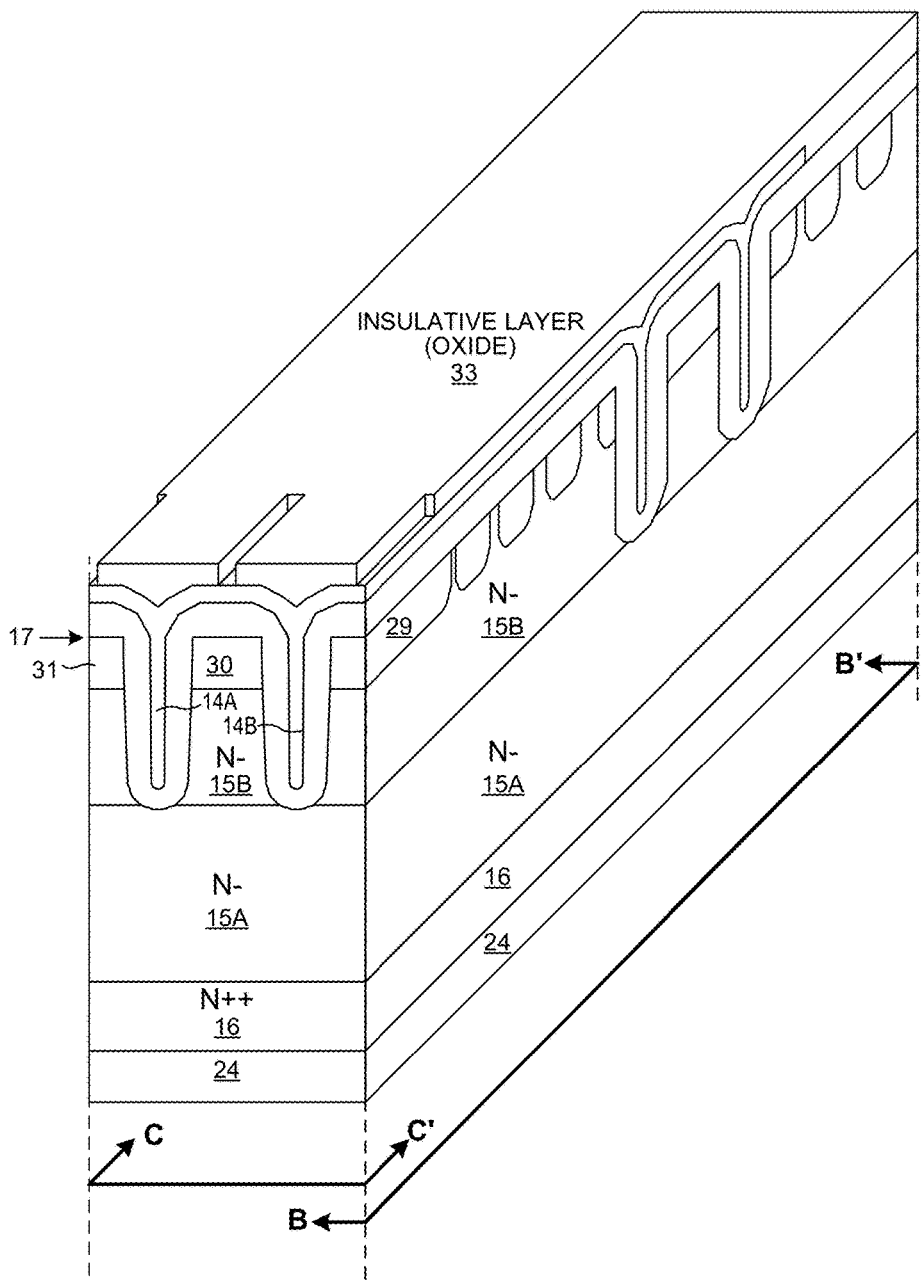
FIG. 10 is a perspective diagram of the structure of FIG. 9, but with the body metal not shown.

FIG. 10 is a perspective diagram of the structure of FIG. 9, but with the body metal structure 27 not shown.

Figure 11:
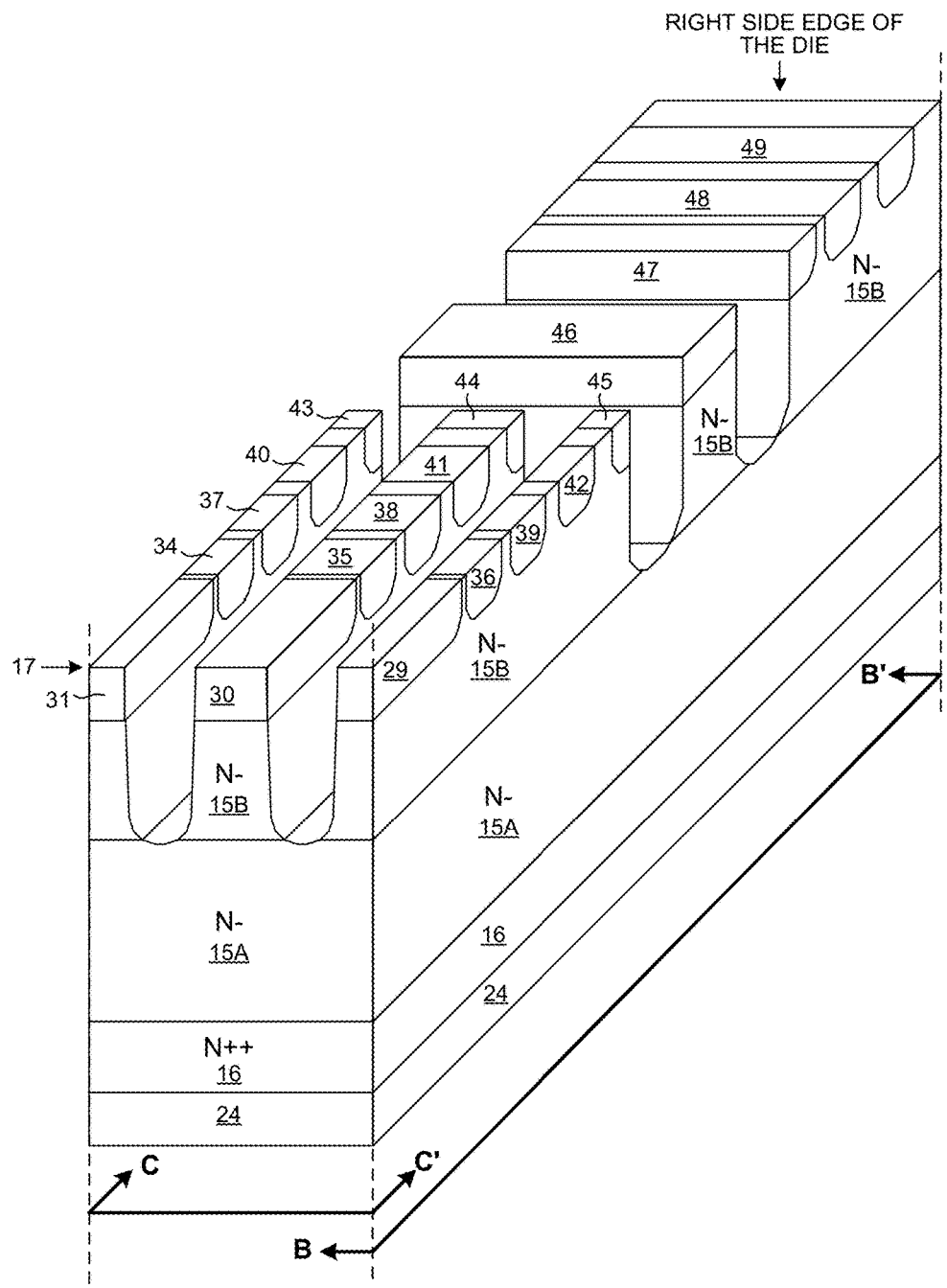
FIG. 11 is a perspective diagram of the structure of FIG. 10, but with the trench fill material not shown and with the structure above the topside semiconductor surface 17 not shown.

FIG. 11 is a perspective diagram of the structure of FIG. 10, but with the trench fill material not shown and with the structure above the topside semiconductor surface 17 not shown. This diagram reveals many isolated and floating P type regions 34-49. Each of these floating P type regions is entirely separate from each of the others. Each of these P type regions is floating, and is not coupled to the source electrode structure of the die, nor to the drain electrode structure of the die, nor to the gate electrode structure of the die. The P type regions 46-49 are actually concentric ring-shaped structures that ring around the periphery of the semiconductor die structure 1 when the semiconductor die structure 1 is considered from the top-down perspective. P type body region extensions 44, 41, 38, 35 and 30 are entirely disposed between the between the third deep trench 8 (see FIG. 2) and the fourth deep trench 9 (see FIG. 2). The P type body region extensions 44, 41, 38 and 35 are disposed entirely between the active area 10 (see FIG. 1) and the right side edge 2 of the die (see FIG. 1).

Figure 12:
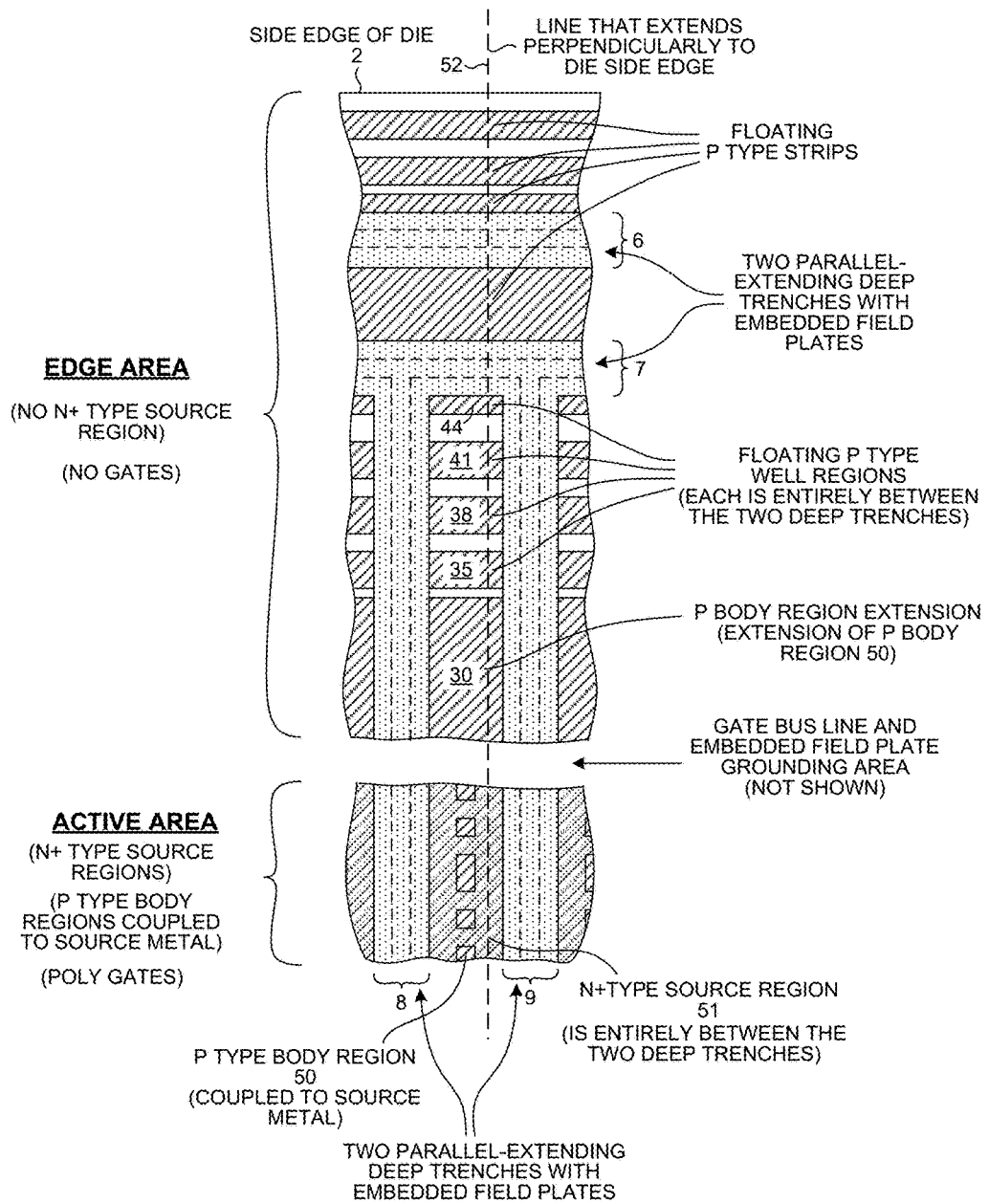
FIG. 12 is a simplified top-down diagram that illustrates the relative positions of various features and structures of the semiconductor die structure 1 of FIG. 1.

FIG. 12 is a simplified top-down diagram that illustrates the relative positions of various features and structures of the semiconductor die structure 1 of FIG. 1. In the orientation of the diagram, the first peripheral deep trench 6 extends in a first straight line parallel to the right side edge 2 of the die. The second peripheral deep trench 7 extends in a second straight line parallel to the first line. Deep trenches 6 and 7 are a pair of deep trenches that extend parallel to one another, and parallel to the right side edge 2. Third deep trench 8 extends in a third straight line. The third line is perpendicular to the right side edge 2. Fourth deep trench 9 extends in a fourth straight line. The fourth line is parallel to the third line. The third 8 and the forth deep trench 9 extend parallel to one another, and perpendicular to the right side edge 2. The third deep trench 8 terminates into the second peripheral deep trench 7. Likewise, the fourth deep trench 9 terminates into the second peripheral deep trench 7. These deep trenches 6, 7, 8 and 9 are the same deep trenches as illustrated in FIG. 2 and as described in the text above. P type body region extensions 31, 30 and 29 are not floating, but rather they are connected to the source metal in the active area.

The embedded field plate structure 14 is disposed at least partly in the four deep trenches 6, 7, 8 and 9. A first part of the embedded field plate structure 14 is disposed at least partly in the first peripheral deep trench 6. A second part of the embedded field plate structure 14 is disposed at least partly in the second peripheral deep trench 7. A third part of the embedded field plate structure 14 is disposed at least partly in the third deep trench 8. A fourth part of the embedded field plate structure 14 is disposed at least partly in the fourth deep trench 9.

The P type body region 50 is disposed in the edge area 12, but it has a P type body region extension 30 that extends laterally through the gate bus line and embedded field plate grounding area 11, and into the edge area 12. The P type body region 50 is also disposed entirely between the third deep trench 8 and the forth deep trench 9. The N+ type source region 51 is disposed entirely in the edge area 12 and between the third deep trench 8 and the fourth deep trench 9. The part 13A of the gate structure 13 is disposed at least partly in the third deep trench 8 in the active area 10, and the part 13B of the gate structure 13 is disposed at least partly in the fourth deep trench 9 in the active area 10. No part of the gate structure 13 extends into the edge area 12 of the die. Each of the floating P type body regions 44, 41, 38 and 35 is disposed entirely between the third deep trench 8 and the forth deep trench 9, and entirely within the edge area 12 of the die. The constituent parts of the structure of FIG. 12 are oriented such that the P type body region extensions 44, 41, 38, 35 and 30 are disposed along a fifth straight line 52. The fifth straight line 52 extends perpendicularly to the right side edge 2, and extends from the right side edge 2, and then extends transversely through the first peripheral deep trench 6, and then extends transversely through the second peripheral deep trench 7, and then extends between the third deep trench 8 and the fourth deep trench 9, and into the edge area 12 of the die. The P type body region extensions 44, 41, 38, 35 and 30 are disposed along this fifth straight line 52 as illustrated in FIG. 12 between the right side edge 2 and the active area 10.

Figure 13:
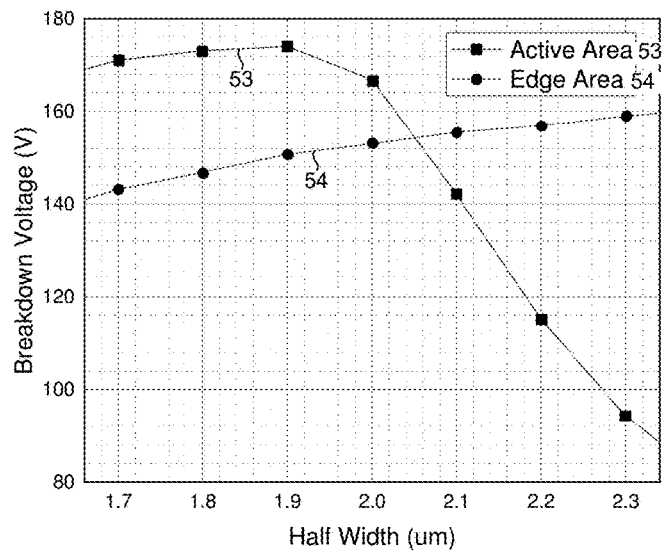
FIG. 13 is a graph that shows how breakdown voltage varies with unit cell half width for the alternative semiconductor die structure of FIG. 14.
Figure 14:
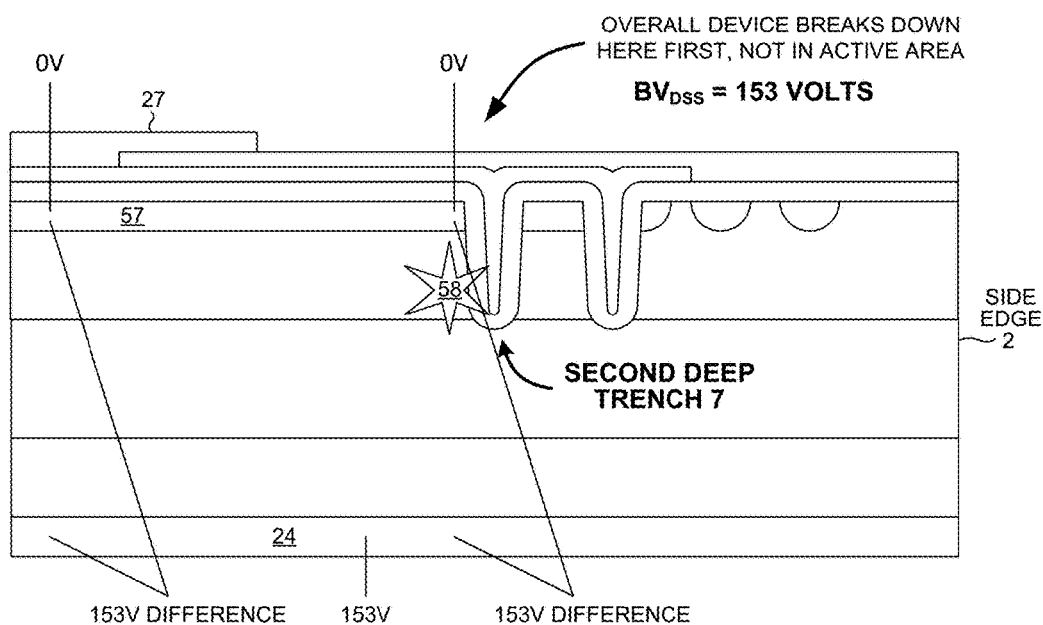
FIG. 14 illustrates an alternative semiconductor die structure that has a different edge area structure.

FIG. 13 and FIG. 14 illustrate and explain an alternative semiconductor die structure that has a different edge area structure. Rather than having the novel plurality of floating P type body regions 44, 41, 38 and 35 as shown in FIG. 12, the alternative semiconductor die structure has a single P type region 57. This single P type region 57 extends outwardly from the location of the A-A' section of FIG. 3 all the way to the second peripheral deep trench 7. In other respects, the alternative semiconductor die structure is the same as the novel semiconductor die structure 1 of FIG. 1. The horizontal axis of the diagram of FIG. 13 sets forth the half width of the unit cell of the semiconductor die structure. The line 53, which is denoted with squares, indicates how the breakdown voltage of the active area varies as a function of unit cell half width. The line 54, which is denoted with circles, is a simulation result that indicates how the breakdown voltage of the edge area varies as a function of unit cell half width. At a unit cell half width of 2.0 microns, the alternative semiconductor die structure was simulated to suffer avalanche breakdown in the location indicated by the star 58 at a breakdown voltage BVDSS of 153 volts. The breakdown voltage BVDSS of the overall N-channel field effect transistor die is therefore lower than it otherwise could be were the device not to break down first in its edge area. The breakdown voltage BVDSS of the overall N-channel field effect transistor die is the lower of the two lines of FIG. 13 at the location of the 2.0 unit cell half width.

Figure 15:
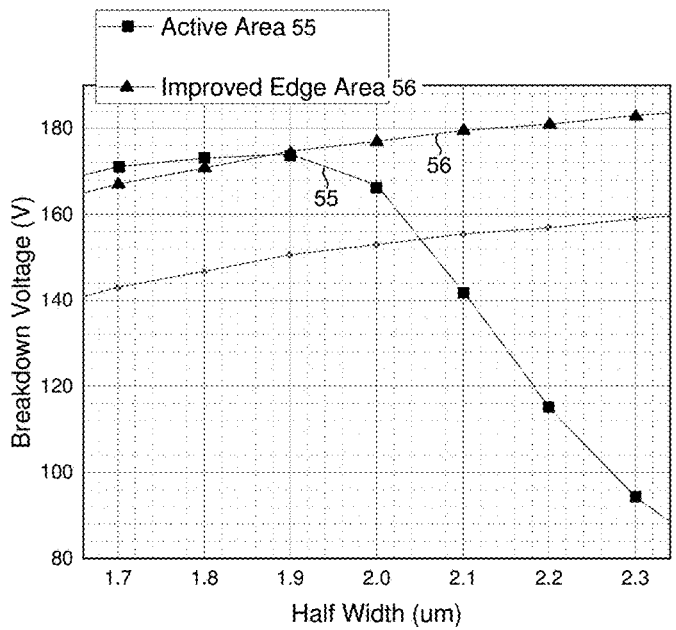
FIG. 15 is a graph that shows how breakdown voltage varies with unit cell half width for the alternative semiconductor die structure of FIG. 16.

FIG. 15 and FIG. 16 illustrate and explain a relative advantage of the novel structure of the edge area 12 of the novel semiconductor die structure 1. The line 55, which is denoted with squares, shows how the breakdown voltage of the active area varies as a function of unit cell half width. The line 56, which is denoted with triangles, shows how the breakdown voltage of the edge area varies as a function of unit cell half width. At a unit cell half width of 2.0 microns, the breakdown voltage of the overall semiconductor die structure is determined by the breakdown voltage of the active area because the breakdown voltage of the edge area (as indicated by line 56) is greater than the breakdown voltage of the active area. At the location of a unit cell half width of 2.0, the line 56 is higher than is the line 55. As shown in FIG. 16, there can be a large 167 volt difference between the 167 volt potential on the bottomside drain metal electrode structure 24 and the zero volt potential on the P type body region extension 30, but yet the gaps between the P type body region extensions 30, 35, 38, 41 and 44 allow the potentials on the floating regions to be different from one another. The zero volt potential on the leftmost P type body region extension 30 therefore does not extend laterally to the right all the way to the left edge of the second peripheral deep trench 7 due to there being a single conductive P type region spanning this distance. Rather, the 167 volt difference can drop across this lateral distance. The voltages on the P type body region extensions 30, 35, 38, 41 and 44 are zero volts, six volts, twelve volts, eighteen volts, and twenty-four volts, respectively. This means that the relative voltage at the left edge of the second peripheral deep trench 7 in the case of the structure of FIG. 16 is only 143 volts even though there is a larger 167 volt difference between the drain metal electrode structure 24 with respect to the source metal electrode structure 26. The overall semiconductor die structure is simulated to have a breakdown voltage BVDSS of 167 volts. Due to limitations of simulation software, the line 56 is actually a simulation of a similar structure that does not have three planar sidewalls (sidewall of deep trenches 7, 8 and 9) but rather has a half-cylindrical radius sidewall structure.

Figure 17:
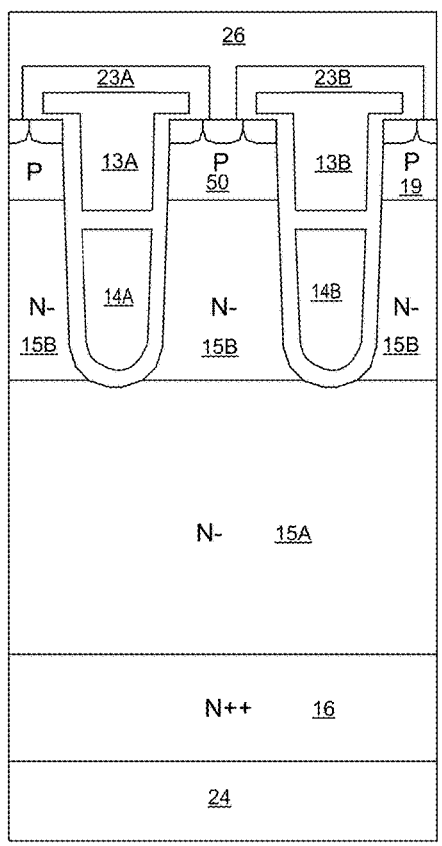
FIG. 17 is a cross-sectional diagram that shows another embedded field plate structure in the active area of a semiconductor die structure.
Figure 18:
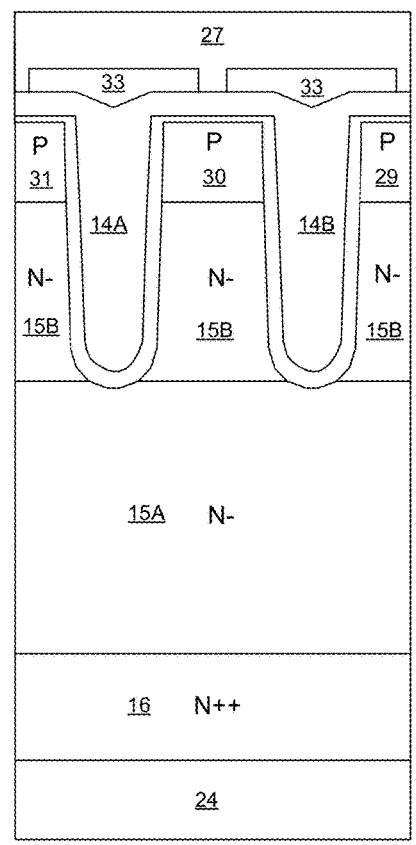
FIG. 18 is a cross-sectional diagram that shows another embedded field plate structure in the edge area of a semiconductor die structure.

Although certain specific embodiments are described above for instructional purposes, the teachings of this patent document have general applicability and are not limited to the specific embodiments described above. Although a particular gate structure and embedded field plate structure is shown in the deep trenches, in other embodiments other gate structures and other embedded field plate structures are used. Utility of the floating P type body regions 44, 41, 38 and 35 between the active area and the peripheral deep trenches is not limited to a particular gate structure/embedded field plate design. Within a given semiconductor device, the embedded field plate can have a different form in the active area as compared to the form it has in the edge area. For example, the structure of FIG. 17 can be employed in the active area and the structure of FIG. 18 can be employed in the edge area. In the cross-section of FIG. 17 the embedded field plate is disposed entirely below the bottom extent of the gate structure. The bottom extent of the gate structure is at or slightly below the bottom extent of the P type body regions. The floating P type body regions 44, 41, 38 and 35 can be employed with these types of buried field plate structures as well. Accordingly, various modifications, adaptations, and combinations of various features of the described embodiments can be practiced without departing from the scope of the invention as set forth in the claims.

What is claimed is:

1. A semiconductor die structure that has an edge area and an active area, the semiconductor die structure comprising:

an N− type drift layer, wherein a first deep trench extends down into the N− type drift layer, wherein the first deep trench extends in a first straight line parallel to a side edge of the semiconductor die structure, wherein a second deep trench extends down into the N− type drift layer, wherein the second deep trench extends in a second straight line parallel to the first straight line of the first deep trench, wherein a third deep trench extends down into the N− type drift layer, wherein the third deep trench extends in a third straight line perpendicular to the side edge of the semiconductor die and terminates into the second deep trench, wherein a fourth deep trench extends in a fourth straight line perpendicular to the side edge of the semiconductor die and terminates into the second deep trench, wherein the first straight line is parallel to the second straight line, and wherein the third straight line is parallel to the fourth straight line;

an embedded field plate structure that is disposed at least partly in the third deep trench and that is disposed at least partly in the fourth deep trench;

a P type body region that extends down into the N– type drift layer, wherein the P type body region is disposed in the active area of the semiconductor die structure between the third deep trench and the fourth deep trench, wherein no part of the P type body region extends into the edge area of the semiconductor die structure;

an N+ type source region that extends down into the P type body region, wherein the N+ type source region is disposed in the active area of the semiconductor die structure between the third deep trench and the fourth deep trench;

a first floating P type well region that extends down into the N– type drift layer, wherein the first floating P type well region is disposed entirely in the edge area of the semiconductor die structure, wherein the first floating P type well region is disposed entirely between the third deep trench and fourth deep trench;

a second floating P type well region that extends down into the N– type drift layer, wherein the second floating P type well region is disposed entirely in the edge area of the semiconductor die structure, wherein the second floating P type well region is disposed entirely between the third deep trench and the fourth deep trench, wherein the first deep trench, the second deep trench, the first floating P type well region, the second floating P type well region, and the P type body region are disposed such that they are disposed along a fifth straight line, wherein the fifth straight line extends perpendicularly from the side edge of the semiconductor die structure and extends transversely through the first deep trench and the second deep trenchs, and extends between the third deep trench and the fourth deep trench, and into the active area of the semiconductor die structure, wherein the first and second floating P type well regions are disposed along the fifth straight line and between the P type body region and the second deep trench;

a gate structure that is at least partly disposed in the third deep trench and that is at least partly disposed in the fourth deep trench, wherein the gate structure is disposed in the active area of the semiconductor die structure;

a gate electrode that is coupled to the gate structure;

a drain electrode; and a source electrode that is coupled to the N+ type source region.

2. The semiconductor die structure of claim 1, wherein the semiconductor die structure has a topside semiconductor surface, wherein the N– type drift layer comprises a lower layer portion and an upper layer portion, wherein the lower layer portion of the N-type drift layer has a lower concentration of N type dopants than does the upper layer portion of the N– type drift layer, wherein the upper layer portion of the N-type drift layer is disposed on the lower layer portion of the N-type drift layer and extends up to the topside semiconductor surface.

3. The semiconductor die structure of claim 2, wherein each of the first deep trench, the second deep trench, the third deep trench and the fourth deep trench extend into the lower layer portion of the N– type drift layer.

4. The semiconductor die structure of claim 1, wherein no part of the gate structure extends into the edge area of the semiconductor die structure.

5. The semiconductor die structure of claim 1, wherein the source electrode is coupled to the P type body region.

6. The semiconductor die structure of claim 1, wherein a first part of the embedded field plate structure is disposed in the first deep trench, wherein a second part of the embedded field plate structure is disposed in the second deep trench, wherein a third part of the embedded field plate structure is disposed in the third deep trench, and wherein a fourth part of the embedded field plate structure is disposed in the fourth deep trench.

7. The semiconductor die structure of claim 1, wherein the embedded field plate structure is electrically coupled to the P type body region.

8. The semiconductor die structure of claim 1, wherein the embedded field plate structure is electrically coupled to the source electrode via the P type body region.

9. The semiconductor die structure of claim 1, further comprising:
a third floating P type well region that extends down into the N– type drift layer, wherein the third floating P type well region is disposed entirely in the edge area of the semiconductor die structure, and wherein the third floating P type well region is disposed entirely between the first deep trench and the second deep trench.

10. The semiconductor die structure of claim 1, further comprising:
a third floating P type well region that extends down into the N– type drift layer, wherein the third floating P type well region is disposed entirely in the edge area of the semiconductor die structure, wherein the third floating P type well region is disposed entirely between the first deep trench and the side edge of the semiconductor die structure.

11. The semiconductor die structure of claim 1, wherein the first floating P type well region forms a part of a sidewall of the second deep trench.

12. The semiconductor die structure of claim 1, wherein the embedded field plate structure in the edge area is an amount of N+ type polysilicon, wherein the amount of N+ type polysilicon extends up from the third deep trench and up and over a topside semiconductor layer and down into the fourth deep trench.

13. The semiconductor die structure of claim 12, further comprising:
a body metal layer disposed in the edge area, wherein no part of the body metal layer extends into the active area of the semiconductor die structure, and wherein the body metal layer is electrically coupled to the amount of N+ type polysilicon of the embedded field plate structure in the edge area.

14. A field plate power N-channel field effect transistor die having an active area and an edge area, comprising:
a source metal electrode;
a peripheral deep trench that extends around a periphery of the die, wherein there is no gate disposed in the peripheral deep trench, wherein the peripheral deep trench is disposed in the edge area, and wherein no part of the peripheral deep trench is disposed in the active area;

a plurality of parallel-extending deep trenches, wherein each of these parallel-extending deep trenches extends from the active area and terminates into the peripheral deep trench;

a buried field plate structure that is partly disposed in the peripheral deep trench and that is partly disposed in the plurality of parallel-extending deep trenches;

a P type body region disposed in the active area, wherein the P type body region is coupled to the source metal electrode;

an N+ type source region that extends down into the P type body region; and a plurality of floating P type well regions, wherein each of the plurality of floating P type well regions is disposed entirely in the edge area, wherein a straight line extends from the edge area and to the active area, and wherein the plurality of floating P type well regions are disposed along the straight line between the peripheral deep trench and the active area.

15. The field plate power N-channel field effect transistor die of claim 14, wherein there are no additional P type body regions disposed along the straight line at any location between the peripheral deep trench and the P type body region.

16. The field plate power N-channel field effect transistor die of claim 14, further comprising:

a gate structure, wherein the gate structure is entirely disposed in the active area, and wherein no part of the gate structure extends into the edge area.

\* \* \* \* \*